United States Patent
Van Zyl

(10) Patent No.: US 11,139,148 B2
(45) Date of Patent: Oct. 5, 2021

(54) METHOD AND APPARATUS FOR CHANGING THE APPARENT SOURCE IMPEDANCE OF A GENERATOR

(71) Applicant: Advanced Energy Industries, Inc., Fort Collins, CO (US)

(72) Inventor: Gideon Johannes Jacobus Van Zyl, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 16/158,147

(22) Filed: Oct. 11, 2018

(65) Prior Publication Data

US 2019/0108980 A1   Apr. 11, 2019

Related U.S. Application Data

(60) Provisional application No. 62/570,693, filed on Oct. 11, 2017.

(51) Int. Cl.
*H01J 37/32*   (2006.01)
*G01R 27/16*   (2006.01)
(Continued)

(52) U.S. Cl.
CPC ........ *H01J 37/32183* (2013.01); *G01R 27/16* (2013.01); *G01R 27/32* (2013.01); *H01J 37/32174* (2013.01); *H03H 7/40* (2013.01)

(58) Field of Classification Search
CPC ................. H05H 1/46; H01J 37/32174; H01J 37/32935; H01J 37/32009; H01J 37/3299
See application file for complete search history.

(56) References Cited

U.S. PATENT DOCUMENTS 5,187,454 A    2/1993  Collins et al.
7,970,562 B2   6/2011  van Zyl
(Continued)

OTHER PUBLICATIONS

Scikit-rf.readthedocs.io, (https://scikit-rf.readthedocs.io/en/latest/examples/networktheory/Working%20with%20Complex%20Characteristic%20Impedances.html), "Working with Complex Characteristic Impedance".*

(Continued)

*Primary Examiner* — Borna Alaeddini
(74) *Attorney, Agent, or Firm* — Neugeboren O'Dowd PC

(57) ABSTRACT

A method for controlling a generator connected to a load involving obtaining a first measured value (M1) related to a forward power calculated with respect to reference impedance ($Z_c$). The method involves adjusting an output of the generator in order that M1 tends to a first setpoint. The method further involves adjusting the first setpoint in order to adjust a second measured value (M2) of a conventional measure of generator output towards a second setpoint, where wherein the forward power calculated with respect to the reference impedance ($Z_c$) is equal to:

$$\frac{|v + Z_c i|^2}{2\sqrt{\text{real}(Z_c)}}$$

where v is a voltage at a reference point, which may be between the generator and load input, and i is a current flowing relative to the load (e.g., current toward the load or a negative value of current toward the generator) at the reference point.

61 Claims, 4 Drawing Sheets

(51) Int. Cl.
*G01R 27/32* (2006.01)
*H03H 7/40* (2006.01)

(56) References Cited

U.S. PATENT DOCUMENTS

| | | | | |
|---|---|---|---|---|
| 8,716,939 B2* | 5/2014 | Utano | ...................... | H05H 1/46 |
| | | | | 315/111.41 |
| 9,741,544 B2 | 8/2017 | van Zyl | | |
| 2008/0270048 A1 | 10/2008 | van Zyl | | |
| 2009/0281741 A1* | 11/2009 | van Zyl | ............ | G01R 19/0007 |
| | | | | 702/60 |
| 2010/0174420 A1* | 7/2010 | Van Zyl | ............ | H01J 37/32009 |
| | | | | 700/297 |
| 2012/0280618 A1* | 11/2012 | Utano | ............... | H01J 37/32009 |
| | | | | 315/111.41 |
| 2015/0270104 A1* | 9/2015 | Van Zyl | ............ | H01J 37/32183 |
| | | | | 315/111.21 |

OTHER PUBLICATIONS

Marks et al. "A General Waveguide Circuit Theory"; Journal of Research of the National Institute of Standards and Technology, vol. 97, No. 5, Sep.-Oct. 1992 (Year: 1992).*
Maxim Integrated, "Impedance Matching and the Smith Chart: The Fundamentals", Jul. 22, 2002 (Year: 2002).*
"Problem set-2 Solutions ECE 357" (Year: 2015).*
International Searching Authority, Notification of International Search Report and Written Opinion, issued for International Application No. PCT/US2018/055492, dated Dec. 20, 2018 (13 pages).
EPO, "Communication Pursuant to Rules 161(1) and 162 EPC Regarding Application No. 18795912.7", dated May 19, 2020, pp. 12, Published in: EP.
TIPO, "Office Action Regarding Taiwan Patent Application No. 107135770", dated Nov. 6, 2020, pp. 15, Published in: TW.
Japanese Patent Office, "Office Action Regarding Patent Application No. 2020-520228", dated Jul. 2, 2021, p. 2, Published in: JP.

* cited by examiner

METHOD AND APPARATUS FOR CHANGING THE APPARENT SOURCE IMPEDANCE OF A GENERATOR

CROSS-REFERENCE TO RELATED APPLICATION

This application is related to and claims priority under 35 U.S.C. § 119(e) from U.S. Patent Application No. 62/570,693, filed Oct. 11, 2017 entitled "METHOD AND APPARATUS FOR CHANGING THE APPARENT SOURCE IMPEDANCE OF A GENERATOR," the entire contents of which is incorporated herein by reference for all purposes.

TECHNICAL FIELD

Aspects of the present disclosure involve a power control system for a generator, and more particularly may involve a control system that may change the apparent source impedance of a generator providing power to a plasma load.

BACKGROUND

Plasma processing systems are widely used in a variety of industries for modifying the surface properties of materials. For example, the manufacture of modern integrated circuits generally involves many processing steps that use plasmas for etching of submicrometer features, or for depositing atomically thin layers of materials. A typical plasma processing system comprises a processing chamber and a power delivery system that creates and maintains the plasma inside the chamber. Electrically, the plasma presents a nonlinear load to the power delivery system. The impedance presented to the power delivery system by the plasma is generally not constant, however, but may vary depending upon the power delivered to the plasma, gas pressure and chemistry and other process conditions or other variables.

As is well documented (see, e.g., U.S. Pat. No. 9,741,544 (the '544 patent)), interactions between a generator and a nonlinear load (e.g., a plasma load) can lead to instabilities. As explained in the '544 patent, a generator with a source impedance matched to the plasma system impedance presented to the generator is not always optimal for plasma stability. For highly sensitive plasma systems (where the impedance presented to the generator by the plasma system changes sharply as a function of applied power), offsetting the generator source impedance results in better stability. The '544 patent describes a method for physically changing the generator source impedance to offset if from the plasma system impedance. In one example, different length cables are used to alter the generator source impedance.

It is with these observations in mind, among others, that aspects of the present disclosure were conceived and developed.

SUMMARY

Aspects of the present disclosure may involve a method, system, apparatus and the like for controlling a generator connected to a load, such as a plasma chamber and associated plasma load. With respect particularly to the method albeit applicable to a system and apparatus, it involves adjusting an output of a generator in order that a first measured value (M1) related to a forward power calculated with respect to a reference impedance ($Z_c$) tends to a first setpoint (S1) for M1. The method further involves adjusting S1 in order to adjust a second measured value (M2) of a conventional measure of generator output towards a second setpoint (S2) for M2. The forward power calculated with respect to the reference impedance ($Z_c$) is equal to $$\left| \frac{v + Z_c i^2}{2\sqrt{\text{real}(Z_c)}} \right|$$

where v is a voltage at a reference point and i is a current flowing relative to the load at the reference point. The method may be implemented by a controller, controllers, the generator, an impedance matching network, and other components of a power delivery system.

Aspects of the present disclosure further involve a method, apparatus, system and the like for controlling a generator coupled with a load, such as a plasma chamber and associated plasma load. With method (as well as the system, etc.) involves receiving a setpoint for a conventional measure of generator output, and controlling a power output from the generator so that: a conventional measure of generator output tends to the setpoint for slow changes in the setpoint and for slow changes in an impedance that the load presents to the generator, and for fast changes in the impedance that the load presents to the generator, forward power calculated with respect to a reference impedance $Z_c$ tends to remain constant. The forward power calculated with respect to a reference impedance $Z_c$ is equal to $$\left| \frac{v + Z_c i^2}{2\sqrt{\text{real}(Z_c)}} \right|$$

where v is a voltage at a reference point and i is a current flowing relative to the load at the reference point.

In another aspect, a method of controlling a generator connected to a load involves calculating a measured value related to forward power delivered to a load calculated with respect to a reference impedance, $Z_c$. A first controller receives a setpoint for said value related to forward power calculated with respect to the reference impedance, $Z_c$, and the first controller adjusts the output of the generator in order that the measured value related to forward power delivered to a load calculated with respect to the reference impedance, $Z_c$ tends to the setpoint. The method further involves receiving a conventional power setpoint and a measurement of the conventional power value by a second controller, which may be embodied in the same control unit as the first controller, that adjusts the setpoint to the first controller in order to adjust the measurement of the conventional power value towards the conventional power setpoint. The forward power with respect to $Z_c$ is equal to a scalar times the magnitude squared of a voltage at a reference point plus $Z_c$ times the current flowing either from the generator to the load of from the load to the generator at the reference point.

BRIEF DESCRIPTION OF THE DRAWINGS

The various features and advantages of the present disclosure set forth herein will be apparent from the following description of particular embodiments of those inventive concepts, as illustrated in the accompanying drawings. It should be noted that the drawings are not necessarily to scale; however the emphasis instead is being placed on illustrating the principles of the inventive concepts. It is

DETAILED DESCRIPTION

Figure 1:
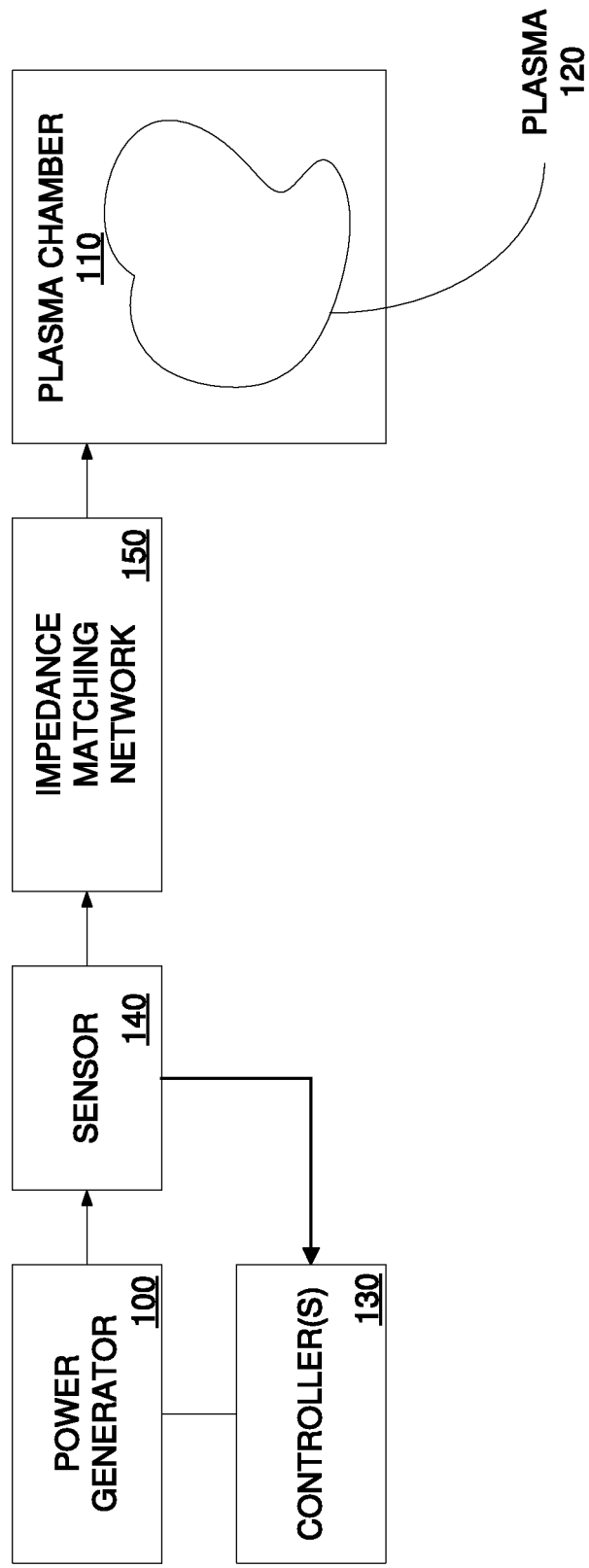
FIG. 1 is a schematic diagram illustrating a generator powering a plasma load, including a control system for controlling the apparent source impedance of the generator.

A new and highly effective method for modifying interactions between an electrical generator and a nonlinear load by changing the apparent source impedance of a generator is described herein. In one example, the systems and methods described herein may achieve the same, similar or more beneficial effect than the physical system as discussed in the '544 patent, which is hereby incorporated by reference, but through control means. Of course, the control systems and methods discussed herein may be used in combination with the physical methods and system discussed in the '544 patent. Doing it through control, whether alone or in combination with physical means, improves overall system performance since only physically offsetting the generator source impedance in general may impede the ability of the generator to deliver power in some situations and may impede the ability to adapt to mismatched loads.

Generally speaking, a generator includes a control system designed to deliver a desired level of forward or delivered power to a load. The generator is designed to deliver power to a variable or nonlinear load (e.g. a plasma load) and controls either forward or delivered power to the plasma load. The control system may also limit the maximum power reflected from the load. For example, in a 50Ω system (where the nominal impedance presented to the generator is 50Ω, for example) with v being the voltage at a reference point and i being the current towards the load at the same reference point, the forward signal, a, from the generator's perspective is:

$$a = \frac{v + 50i}{2\sqrt{50}}$$

and the reflected signal, b, is:

$$b = \frac{v - 50i}{2\sqrt{50}}$$

With these definitions, the actual power delivered to the load, $P_{del}$, is:

$$P_{del} = |a|^2 - |b|^2.$$

Forward power, $P_{fwd}$, is defined as:

$$P_{fwd} \stackrel{def}{=} |a|^2$$

Reflected power, $P_{rfl}$, is defined as:

$$P_{rfl} \stackrel{def}{=} |b|^2$$

An important parameter for determining a reference impedance used to split delivered power into forward and reflected power is the multiplier of i in the definition of a and b above. The factor $2\sqrt{50}$ can be considered a convenience so that no scale factor needs to be applied when calculating power in the equation $P_{del} = |a|^2 - |b|^2$.

Typically a and b are determined from signals obtained from a coupler or voltage-current (vi) sensor. As part of the calibration of the generator, a matrix is determined so that with the phasors $v_f$ and $v_r$ obtained from the sensor, we have:

$$\begin{bmatrix} a \\ b \end{bmatrix} = \begin{bmatrix} k_{11} & k_{12} \\ k_{21} & k_{22} \end{bmatrix} \begin{bmatrix} v_f \\ v_r \end{bmatrix} \stackrel{def}{=} M_c \begin{bmatrix} v_f \\ v_r \end{bmatrix}$$

where $M_c$ is a matrix obtained through calibration of the generator. Details on how to implement a measurement system that can find a and b can, for example, be found in U.S. Pat. No. 7,970,562, which is hereby incorporated by reference.

In accordance with aspects of the present disclosure, a set of forward and reflected signals with respect to a different reference impedance, $Z_c$, is calculated. A fast inner loop controls forward power calculated with respect to the computed reference impedance $Z_c$. Since forward power calculated with respect to an arbitrary $Z_c$ does not conform to any recognizable notion of forward power (by simply re-calculating forward power with respect to $Z_c$, forward power can be changed from the actual delivered power to ∞ and reflected power from zero to ∞ through an appropriate choice of $Z_c$) an outer loop is run that controls with respect to a recognizable notion of power, such as delivered power (which remains correct independent of how changing $Z_c$ alters how delivered power is split between forward and reflected power) or forward power with respect to a conventional reference impedance such as 50Ω or 75Ω.

To illustrate these concepts, consider a generator delivering 500 W forward power to a load with an impedance of 52+j5Ω (where j=$\sqrt{-1}$). We then have:

$$500 = |a|^2$$

$$= \frac{|v + 50i|^2}{200}$$

$$= \frac{|(52 + j5)i + 50i|^2}{200}$$

$$= \frac{|i|^2 |102 + j5|^2}{200}$$

$$\Rightarrow |i| = \sqrt{\frac{200 \times 500}{|102 + j5|^2}}$$

$$\approx 3.0966.$$

We can choose i to be our reference for phase, so then:

$$i \approx 3.0966 \angle 0 = 3.0966.$$

From this:

$$v \approx 3.0966(52+j5) = 161.02 + j15.48,$$

and:

$$P_{del} = \text{real}(v \times i^*) \approx 161.02 \times 3.0966 \approx 498.61 \text{ W}$$

where x* signifies the complex conjugate of x.
We can also calculate reflected power as:

$$\begin{aligned}P_{rfl} &= |b|^2 \\ &= \frac{|v - 50i|^2}{200} \\ &\approx \frac{|161.02 + j15.48 - 50 \times 3.097|^2}{200} \\ &\approx \frac{|6.17 + j15.48|^2}{200} \\ &\approx \frac{277.7}{200} \approx 1.39\end{aligned}$$

and as expected this matches:

$$P_{rfl} = P_{fwd} - P_{del} \approx 500 - 498.61 = 1.39.$$

With respect to an arbitrary impedance, $Z_c$, the incident signal, $a_{Z_c}$, is:

$$a_{Z_c} \stackrel{def}{=} \frac{v + Z_c i}{2\sqrt{\text{real}(Z_c)}}$$

the reflected signal with respect to $Z_c$, $b_{Z_c}$, is:

$$b_{Z_c} \stackrel{def}{=} \frac{v - Z_c * i}{2\sqrt{\text{real}(Z_c)}}$$

forward power with respect to $Z_c$, $$P_{fwd_{Z_c}},$$

is:

$$P_{fwd_{Z_c}} \stackrel{def}{=} |a_{Z_c}|^2$$

and reflected power with respect to $Z_c$, $$P_{rfl_{Z_c}},$$

is $$P_{rfl_{Z_c}} \stackrel{def}{=} |b_{Z_c}|^2.$$

It can be shown that with these definitions, we still have:

$$P_{del} = P_{fwd_{Z_c}} - P_{rfl_{Z_c}}.$$

To illustrate, let:

$$Z_c = 62 + j83$$

and calculate forward and reflected power under the same conditions as before, i.e. for a generator delivering 500 W forward power calculated with respect to 50Ω into a load impedance of 52+j5. We find that:

$$\begin{aligned}a_{Z_c} &\stackrel{def}{=} \frac{v + Z_c i}{2\sqrt{\text{real}(Z_c)}} \\ &\approx \frac{161.02 + j15.48 + (62 + j83)3.0966}{2\sqrt{62}} \\ &\approx 22.4160 + j17.3036,\end{aligned}$$

the reflected signal with respect to $Z_c$, $b_{Z_c}$, is:

$$\begin{aligned}b_{Z_c} &\stackrel{def}{=} \frac{v - Z_c^* i}{2\sqrt{\text{real}(Z_c)}} \\ &\approx \frac{161.02 + j15.48 - (62 - j83)3.0966}{2\sqrt{62}} \\ &\approx -1.9663 + j17.3036, \\ P_{fwd_{Z_c}} &\stackrel{def}{=} |a_{Z_c}|^2 \\ &\approx 801.8893, \text{ and} \\ P_{rfl_{Z_c}} &\stackrel{def}{=} |b_{Z_c}|^2 \\ &\approx 303.2796.\end{aligned}$$

As expected, we still have:

$$\begin{aligned}P_{del} &= P_{fwd_{Z_c}} - P_{rfl_{Z_c}} \\ &\approx 801.8893 - 303.2796 \approx 498.61.\end{aligned}$$

Note that with respect to this arbitrary choice of $Z_c$=62+j83, the delivered power of 498.61 W is split into forward power of approximately 801.89 W and reflected power of 303.28 W. This illustrates why an outer loop with respect to a recognizable quantity is necessary, in some embodiments. Stated differently, 500 watts of forward power with respect to 50 ohms is an understood convention whereas the concept set out herein involving, for example, 800 W forward power with respect to 62+j83 is an entirely new concept, and the use of an outer loop allows the user or system controller to specify the generator output in terms of understood conventions. To further illustrate the point one can verify that:

1) with respect to $Z_c = Z_L^* = 52-j5$, forward power is equal to delivered power (≈498.61 W) and reflected power is zero, and
2) with respect to $10^6 \Omega$, an arbitrarily chosen setpoint for illustration, forward power is approximately 2397411.07 W and reflected power is approximately 2396912.46 W and as expected the difference is still the actual delivered power or approximately 498.61 W.

Note that the first result above is not an accident since when delivering power into a load of $Z_c^*$, $v=Z_c^* i$ and thus the reflected signal with respect to $Z_c$ is zero:

$$b_{Z_c} \overset{def}{=} \frac{v - Z_c^* i}{2\sqrt{\text{real}(Z_c)}}$$

$$= \frac{Z_c^* i - Z_c^* i}{2\sqrt{\text{real}(Z_c)}}$$

$$= \frac{0}{2\sqrt{\text{real}(Z_c)}}$$

$$= 0.$$

This example illustrates that delivered power can be split into forward power from a value equal to the actual power delivered to the load to ∞ and reflected ranging from zero to ∞ simply by changing the reference impedance with respect to which forward and delivered power is calculated.

The effect of controlling forward power so that forward power, calculated with respect to $Z_c$, is held constant is the following:

1) into a load of $Z_c^*$ reflected power is zero and thus into a load of $Z_c^*$ delivered power is equal to forward power calculated with respect to $Z_c$,
2) into any load other than $Z_c^*$ delivered power is less than delivered power into $Z_c^*$.

The effect of holding forward power calculated with respect to $Z_c$ constant with a control system is that inside the control system bandwidth, it appears as though the generator has a source impedance of $Z_c$.

We thus have, within the bandwidth of the control system that controls forward power with respect to $Z_c$, a generator that appears to have a source impedance of $Z_c$. The advantages of controlling source impedance for changing how the generator interacts with a nonlinear load is explained in the '544 patent and include, among others, improving generator stability in the presence of a varying and/or non-linear load.

To implement a control system that controls forward power with respect to an arbitrary reference impedance one finds that since:

$$\begin{bmatrix} a \\ b \end{bmatrix} = M_c \begin{bmatrix} v_f \\ v_r \end{bmatrix}$$

and also, by definition:

$$\begin{bmatrix} a \\ b \end{bmatrix} = \frac{1}{2\sqrt{50}} \begin{bmatrix} 1 & 50 \\ 1 & -50 \end{bmatrix} \begin{bmatrix} v \\ i \end{bmatrix}, \text{ and}$$

$$\begin{bmatrix} a_{Zc} \\ b_{Zc} \end{bmatrix} = \frac{1}{2\sqrt{\text{real}(Zc)}} \begin{bmatrix} 1 & Z_c \\ 1 & -Z_c^* \end{bmatrix} \begin{bmatrix} v \\ i \end{bmatrix}$$

we have:

$$\begin{bmatrix} a_{Zc} \\ b_{Zc} \end{bmatrix} = \frac{1}{2\sqrt{\text{real}(Z_c)}} \begin{bmatrix} 1 & Z_c \\ 1 & -Z_c^* \end{bmatrix} \begin{bmatrix} v \\ i \end{bmatrix}$$

$$= \frac{1}{2\sqrt{\text{real}(Z_c)}} \begin{bmatrix} 1 & Z_c \\ 1 & -Z_c^* \end{bmatrix} \left( \frac{1}{2\sqrt{50}} \begin{bmatrix} 1 & 50 \\ 1 & -50 \end{bmatrix} \right)^{-1} \begin{bmatrix} a \\ b \end{bmatrix}$$

$$= \frac{1}{2\sqrt{\text{real}(Z_c)}} \begin{bmatrix} 1 & Z_c \\ 1 & -Z_c^* \end{bmatrix} 2\sqrt{50} \frac{1}{1\times(-50)-50\times 1} \begin{bmatrix} -50 & -50 \\ -1 & 1 \end{bmatrix} M_c \begin{bmatrix} v_f \\ v_r \end{bmatrix}$$

$$= \frac{1}{2\sqrt{\text{real}(Z_c)}} \begin{bmatrix} 1 & Z_c \\ 1 & -Z_c^* \end{bmatrix} \frac{1}{\sqrt{50}} \begin{bmatrix} 50 & 50 \\ 1 & -1 \end{bmatrix} M_c \begin{bmatrix} v_f \\ v_r \end{bmatrix}$$

$$= \left( \frac{1}{2\sqrt{\text{real}(Z_c)} \times 50} \begin{bmatrix} 1 & Z_c \\ 1 & -Z_c^* \end{bmatrix} \begin{bmatrix} 50 & 50 \\ 1 & -1 \end{bmatrix} M_c \right) \begin{bmatrix} v_f \\ v_r \end{bmatrix}$$

$$= \tilde{M}_c \begin{bmatrix} v_f \\ v_r \end{bmatrix}$$

where now $M_c$ calculates a and b from $v_f$ and $v_r$ and $\tilde{M}_c$ calculates $a_{Z_c}$ and $b_{Z_c}$ from $v_f$ and $v_r$.

Thus, given a calibration matrix $M_c$ and a reference impedance $Z_c$, one can readily calculate a new calibration matrix $\tilde{M}_c$ from which to find the incident and reflected signals with respect to $Z_c$ and thus forward power with respect to $Z_c$ in order to implement aspects of the current invention.

Changing the apparent source impedance of a generator as described herein changes the generator-nonlinear load (plasma) interactions, which is useful for achieving a stable system. It also changes how the generator reacts to a change in load impedance and can thus also be used to affect pulse shape when pulsing or turning on power into a nonlinear load. Such changes can be beneficial for plasma ignition, for example.

FIG. 1 is a schematic diagram of a power generator 100 coupled to a plasma chamber 110 in which a plasma 120 may be ignited and sustained for a variety of industrial or semiconductor fabrication processes. In one example, the system may include a matching network, 150, that is used to match impedance between the plasma load and the generator. The power generator, which may produce a radio frequency (RF) power output to the load, may include a controller 130 discussed in more detail with respect to FIG. 2. Generally speaking, among other functions, the controller controls the apparent source impedance of the generator. The controller may also control power delivered to the plasma load based on conventional (for example with respect to 50Ω) definitions of forward and reflected power. The controller may be part of the generator or the impedance matching network depending on the implementation. The apparent source impedance modification and conventional control functions may be integrated in one controller or separate. It is also possible that the controller or controllers is or are a stand-alone device(s) or otherwise integrated into other components of a power system. The power generator may also include other components such as a DC power source, an RF amplifier, and various sensors including a sensor 140 to measure various attributes of the power delivered to the load at a reference point, which reference point may be between the generator and the load on either side of the matching network 150 if such an impedance matching network is present or even at a point further from the generator than what the load is from the generator or further from the load than what the generator is from the load through mathematical manipulation of the measurements and an assumed characteristic impedance of an imagined transmission line extending beyond the generator and load.

Figure 2:
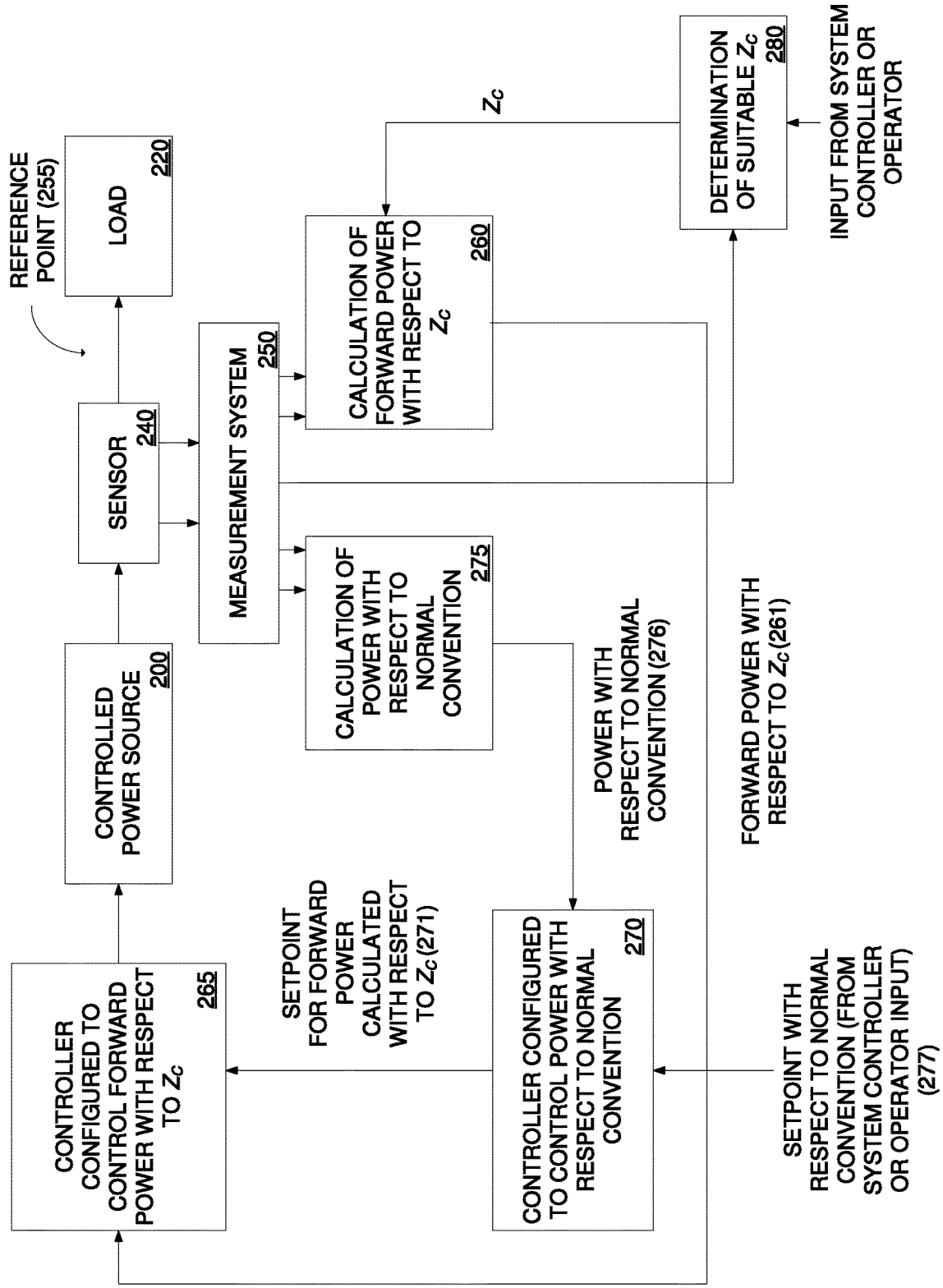
FIG. 2 shows the implementation of a control system and associated operations for controlling the apparent source impedance of a generator.

FIG. 2 illustrates one example of a control system for controlling the apparent source impedance of the generator and further providing a control signal to a power source (generator, power amplifier, converter, inverter) 200 based on forward power calculated with respect to a desired apparent source impedance of the generator. The system diagram also illustrates a method for controlling the apparent source impedance. As discussed above, the system may include a sensor 240 and associated measurement system 250, such as discussed in U.S. Pat. No. 7,970,562. The sensor and measurement system detect and measure aspects of power delivered to the load 220 at a reference point 255.

The system and associated method involve obtaining a value (261) related to forward power (e.g., $$P_{fwd_{Z_c}}),$$

calculated with respect to a reference impedance (e.g., $Z_c$), delivered to a load. The value related to forward power calculated with respect to $Z_c$ may be any value proportional to or dependent on $|v+Z_c i|^2$ where v is a voltage at a reference point 255 (e.g., at the generator output or input to the load) and i is a current flowing towards the load or generator at the reference point. Well known mathematical transformations (e.g. using a Smith chart and rotation of load reflection coefficient towards the load or generator) can move the reference point to any desired location, even to a point further from the load than the generator or to a point further from the generator than the load.

A suitable value of $Z_c$ may be obtained in a variety of ways. In one example, referring to the systems described in the '544 patent, it is possible to test the stability of various systems by varying $Z_c$ and monitoring oscillations based on measurements of forward and reflected voltage for various values of $Z_c$. In particular, if $Z_c$ is the impedance calculated from $$Z_c = 50\frac{1+\rho}{1-\rho}$$

and ρ is a complex number with a fixed magnitude and the angle of ρ is varied between 0 and 360 degrees, the effect is similar to inserting cable lengths varied between 0 and 180 degree delay at the output frequency of the generator (0 to 360 degree rotation of load reflection coefficient) between the generator and nonlinear load, as described in the '544 patent, provided that the magnitude of ρ is large enough (e.g. >0.3). As the phase is varied, oscillations will typically switch between low frequency (typically <1 kHz) and high frequency (typically >10 kHz) oscillations. If a stable area (no oscillations) were to be found, one expects to find it at the boundary between low and high frequency oscillations. Nonetheless, this behavior should make for a fairly easy automatic search for the most favorable setting of $Z_c$—one can monitor the oscillation frequency as one changes settings and choose a setting close to the transition between low and high frequency oscillations. If no completely stable operation is found, choosing a point close to the transition but on the high frequency side of the transition often allows the system to function in an acceptable way. Of course, one can also look at the waveform characteristics such as overshoot and undershoot to make a determination of the best setting for $Z_c$. In addition to varying the angle of ρ, the magnitude of ρ can also be varied to search for a value that results in stable or acceptable operation of the entire system. The determination of $Z_c$ can for example be done by an algorithm 280 implemented in a computer.

Referring still to FIG. 2, the system may include two controllers (265, 270). The controllers may be integrated and are described herein as separate controls simply because they provide different functions in the overall system. The first controller 265 provides a control output to the power source. The first controller receives two inputs—a setpoint from the second controller 270 and the measured forward power with respect to $Z_c$ (261). More particularly, the first controller 265 receives a setpoint from the second controller 270 where the setpoint is for the measured forward value related to forward power calculated with respect to the reference impedance, $Z_c$. The first controller 265 adjusts the output of the generator in order that the measured value related to forward power calculated with respect to the reference impedance, $Z_c$ tends to the second setpoint from controller 270.

The second controller receives conventional power control values. Namely, the second controller receives a conventional setpoint 277 and a measurement of the conventional power value 276 at the reference point 255. The conventional power value may be a voltage, current, real delivered power, forward power with respect to conventional impedance (e.g., 50Ω), and others. The second controller, using the conventional values, provides and adjusts the setpoint to the first controller in order to adjust the measurement of the conventional power value towards the conventional power setpoint. A conventional system would not have the first controller and instead the second controller would simply provide its output to the controlled power source. In the present system and method, the second controller instead provides its output as a setpoint to the first controller. In turn, the first controller receives measurements of a value related to or dependent on forward power calculated with respect to $Z_c$ rather than the conventional measures of power provided to the second controller. For example, if the impedance presented by the load 220 to the generator at the reference point 255 is 60+j10Ω the conventional setpoint 277 is 200 V RMS at the reference point, $Z_c$ is 30+j40Ω and the value related to forward power is $$10\sqrt{\text{Real}(Z_c)P_{fwd_{Z_c}}} = 5|v + (30 + j40)i|$$

then once the controller reaches steady state at the setpoint, the second controller will receive a setpoint 277 of 200 V RMS and receive a measurement 276 of 200 V RMS and provide a setpoint 271 to the first controller of $$5\left|200 + (30 + j40)\frac{200}{60 + j10}\right| \approx 1692.6.$$

The effect of the second controller operating on conventional measures of generator output providing a setpoint to a first controller that controls the generator output to move a value related to forward power calculated with respect to a reference impedance, $Z_c$, to the setpoint provided by the second controller is the following: The generator follows slow changes in the conventional setpoint 277 and for slow changes in the load impedance presented to the generator by the plasma load, the generator output follows the conventional setpoint. For fast changes in the load impedance presented to the generator by the plasma load, the generator tends to keep forward power calculated with respect to a reference impedance, $Z_c$, constant. This behavior produces some of the advantages of the system. This behavior can be achieved by different configurations of the control system. In one example, slow changes may be considered changes that, in the frequency domain, have power density spectra with more than half of the total energy contained below a frequency F1 (e.g., between a value of F1 of between 0 Hz and 10 Hz, and between 0 Hz and 10 kHz) and fast changes are changes that in the frequency domain have power density spectra with more than half of the total energy contained above F1.

In one example, the value related to forward power with respect to $Z_c$ is equal to a scalar times the magnitude squared of a voltage at a reference point plus $Z_c$ times a current flowing relative to the load at the reference point (e.g., the current flowing from the generator to the load at the reference point or minus the current flowing towards the generator). For example, if $Z_c$ is 10+j20, v is the voltage at the reference point and i the current flowing from the generator to the load at the reference point, the value related to forward power with respect to $Z_c$ at the reference point may be $5|v+(10+j20)i|^2$. In another example, the value related to forward power with respect to $Z_c$ is equal to a scalar times the magnitude of a voltage at a reference point plus $-Z_c$ times the current flowing from the load to the generator at the reference point. For example, if $Z_c$ is 10+j20, v is the voltage at the reference point and i the current flowing from the load to the generator at the reference point, the value related to forward power with respect to $Z_c$ at the reference point may be $|v-(10+j20)i|$. In this disclosure, a value related to forward power with respect to $Z_c$ is any value, x, derived from mathematical operations on v and i such that keeping x constant for different combinations of v and i implies keeping $$P_{fwd_{Z_c}}$$

constant for those same combinations of v and i over those combinations of v and i that are relevant to the power delivery system. An example of combinations of v and i that may be relevant to a power delivery system are 0.01<|i|<100 and 0.5|i|<|v|<1000|i| which may mean that the power delivery system is expected to deliver currents between 10 mA and 100 A to a load and the magnitude of the load impedance is between 0.5Ω and 1000Ω. Examples of operations on $$P_{fwd_{Z_c}}$$

to create a value related to $$P_{fwd_{Z_c}}$$

thus include raising to a power (e.g. taking the square root by raising to the power 0.5), multiplying by a scalar, and addition of a scalar. More generally a value related to $$P_{fwd_{Z_c}}$$

may be obtained by applying a one-to-one function to $$P_{fwd_{Z_c}}.$$

It should also be noted that for a DC generator where there is no concept of phase, the same principles can be used to change interactions between a DC generator and a plasma load. In this case v, i and $Z_c$ are real numbers, i.e. instead of being able to choose a complex reference impedance one is limited to choosing a reference resistance. Such a change in apparent source resistance can be useful for stability enhancement, pulse shaping during pulsing or when turning on or changing a setpoint (e.g. power, voltage or current) and for arc handling (how the generator responds to a sudden change in load resistance). The apparent source impedance of a DC generator can be further modified by emulating a reactive source impedance. For example, a source impedance consisting of a resistor R parallel with a capacitor C and the combination in series with an inductance L can be emulated within the control system bandwidth by keeping $$v + RC\frac{dv}{dt} + Ri + L\frac{di}{dt} + RLC\left(\frac{d^2i}{dt^2}\right)$$

constant with a control system.

The value of $Z_c$ may be changed to accomplish different goals. For example, $Z_c$ may have one value at the start of an output of a generator to control the shape of the power as a function of time to enhance ignition and then switch to a different value to achieve stability once the plasma is ignited. For generators generating modulated waveforms (for example pulsing between two different power levels or repeating a waveform with a repetition period), $Z_c$ may be changed in synchronization with the modulated waveform.

Figure 3:
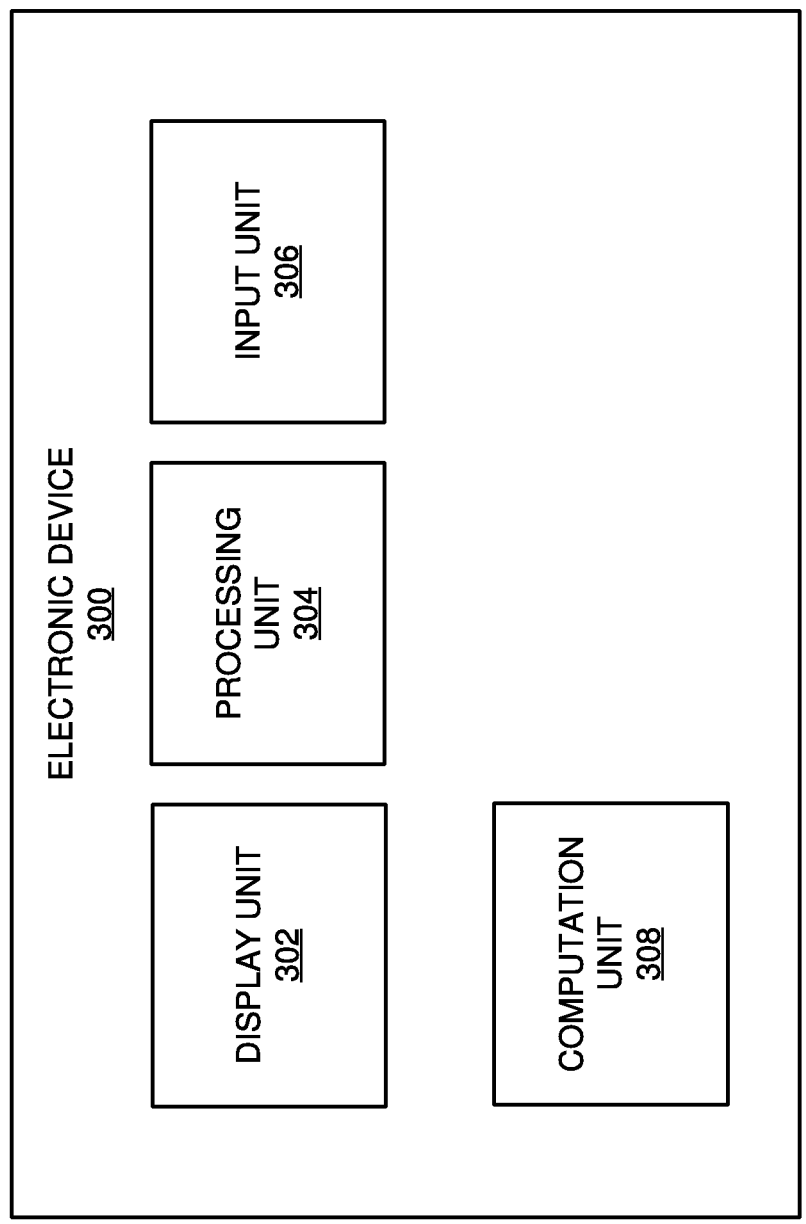
FIG. 3 is a diagram of an electronic device, such as a controller, generator, impedance matching network or other power system component with computing modules configured to perform functions set out in FIG. 2.

Turning to FIG. 3, an electronic device 300 including operational units 302-308 arranged to perform various operations of the presently disclosed technology is shown. The operational units 302-308 of the device 300 are implemented by hardware or a combination of hardware and software to carry out the principles of the present disclosure. It will be understood by persons of skill in the art that the operational units 302-308 described in FIG. 3 may be combined or separated into sub-blocks to implement the principles of the present disclosure, and not all units included in an implementation. Therefore, the description herein supports any possible combination or separation or further definition of the operational units 302-308.

In one implementation, the electronic device 300 includes a display unit 302 configured to display information, such as a graphical user interface, and a processing unit 304 in communication with the display unit 302 and an input unit 306 configured to receive data from one or more input devices or systems. Various operations described herein may be implemented by the processing unit 304 using data received by the input unit 306 to output information for display using the display unit 302. A controller my not include a display unit.

Additionally, in one implementation, the electronic device 300 includes units implementing the operations described with respect to FIG. 2. For example, the operations 260 and 270 may be performed by a computation may be implemented by a measuring unit 508, and the operations 406-412 may be implemented with unit 308. In some implementations, the computation unit 308 further implements various operations for determining or adjusting the value of $Z_c$.

Figure 4:
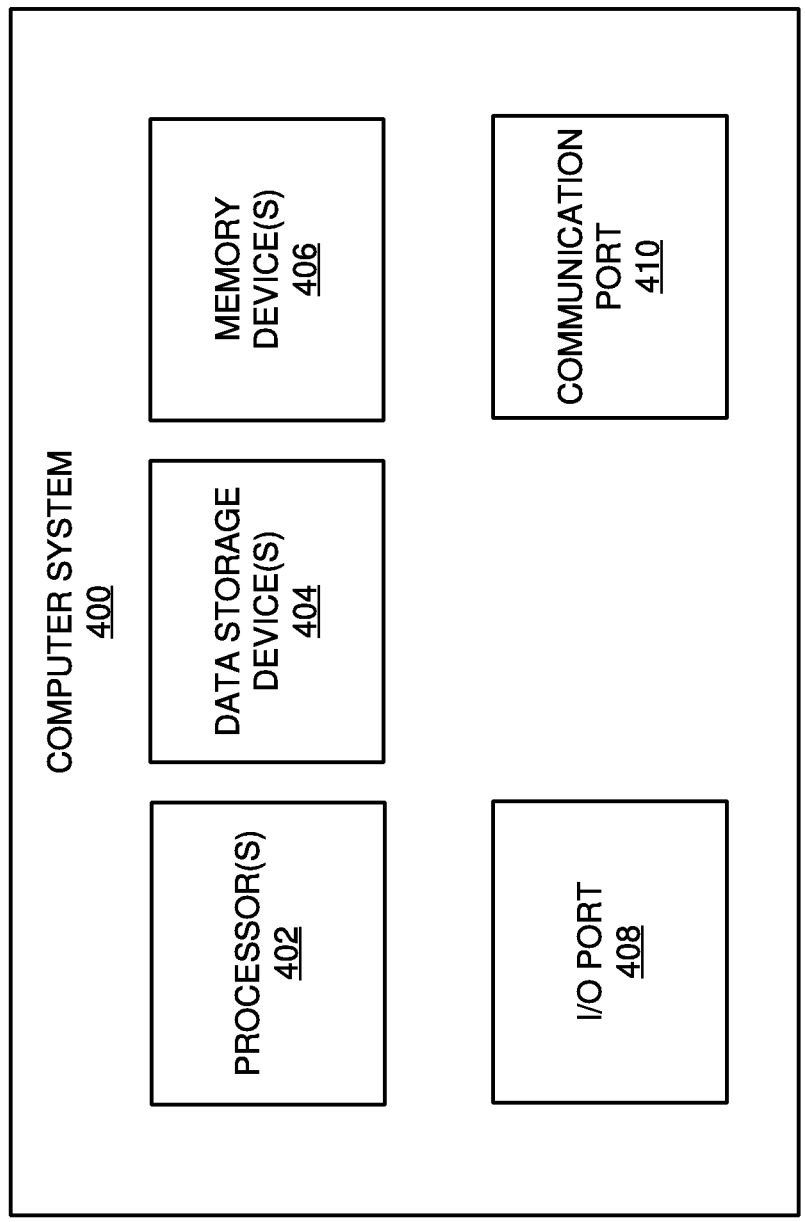
FIG. 4 is a diagram of a computer system with a memory including computer readable instructions configured to perform the operations set out in FIG. 2.

Referring to FIG. 4, a detailed description of an example computing system 400 having one or more computing units that may implement various systems and methods discussed herein is provided. The computing system 400 may be applicable to the controller or controllers, the measurement system, an impedance matching system integrating same or all functions of FIG. 2, the computational unit, and other computing or devices related to the system and method of FIG. 2. It will be appreciated that specific implementations of these devices may be of differing possible specific computing architectures not all of which are specifically discussed herein but will be understood by those of ordinary skill in the art.

The computer system 400 may be a computing system is capable of executing a computer program product to execute a computer process. Data and program files may be input to the computer system 400, which reads the files and executes the programs therein. Some of the elements of the computer system 400 are shown in FIG. 4, including one or more hardware processors 402, one or more data storage devices 404, one or more memory devices 408, and/or one or more ports 408-410. Additionally, other elements that will be recognized by those skilled in the art may be included in the computing system 400 but are not explicitly depicted in FIG. 4 or discussed further herein. Various elements of the computer system 400 may communicate with one another by way of one or more communication buses, point-to-point communication paths, or other communication means not explicitly depicted in FIG. 4.

The processor 402 may include, for example, a central processing unit (CPU), a microprocessor, a microcontroller, a digital signal processor (DSP), and/or one or more internal levels of cache. There may be one or more processors 402, such that the processor 402 comprises a single central-processing unit, or a plurality of processing units capable of executing instructions and performing operations in parallel with each other, commonly referred to as a parallel processing environment.

The computer system 400 may be a conventional computer, a distributed computer, or any other type of computer, such as one or more external computers made available via a cloud computing architecture. The presently described technology is optionally implemented in software stored on the data stored device(s) 404, stored on the memory device(s) 406, and/or communicated via one or more of the ports 408-410, thereby transforming the computer system 400 in FIG. 4 to a special purpose machine for implementing the operations described herein.

The one or more data storage devices 404 may include any non-volatile data storage device capable of storing data generated or employed within the computing system 400, such as computer executable instructions for performing a computer process, which may include instructions of both application programs and an operating system (OS) that manages the various components of the computing system 400. The data storage devices 404 may include, without limitation, magnetic disk drives, optical disk drives, solid state drives (SSDs), flash drives, and the like. The data storage devices 404 may include removable data storage media, non-removable data storage media, and/or external storage devices made available via a wired or wireless network architecture with such computer program products, including one or more database management products, web server products, application server products, and/or other additional software components. Examples of removable data storage media include Compact Disc Read-Only Memory (CD-ROM), Digital Versatile Disc Read-Only Memory (DVD-ROM), magneto-optical disks, flash drives, and the like. Examples of non-removable data storage media include internal magnetic hard disks, SSDs, and the like. The one or more memory devices 406 may include volatile memory (e.g., dynamic random access memory (DRAM), static random access memory (SRAM), etc.) and/or non-volatile memory (e.g., read-only memory (ROM), flash memory, etc.).

Computer program products containing mechanisms to effectuate the systems and methods in accordance with the presently described technology may reside in the data storage devices 404 and/or the memory devices 406, which may be referred to as machine-readable media. It will be appreciated that machine-readable media may include any tangible non-transitory medium that is capable of storing or encoding instructions to perform any one or more of the operations of the present disclosure for execution by a machine or that is capable of storing or encoding data structures and/or modules utilized by or associated with such instructions. Machine-readable media may include a single medium or multiple media (e.g., a centralized or distributed database, and/or associated caches and servers) that store the one or more executable instructions or data structures.

In some implementations, the computer system 400 includes one or more ports, such as an input/output (I/O) port 408 and a communication port 410, for communicating with other computing, network, or vehicle devices. It will be appreciated that the ports 408-410 may be combined or separate and that more or fewer ports may be included in the computer system 400.

The I/O port 408 may be connected to an I/O device, or other device, by which information is input to or output from the computing system 400. Such I/O devices may include, without limitation, one or more input devices, output devices, and/or environment transducer devices.

In one implementation, the input devices convert a human-generated signal, such as, human voice, physical movement, physical touch or pressure, and/or the like, into electrical signals as input data into the computing system 400 via the I/O port 408. Similarly, the output devices may convert electrical signals received from computing system 400 via the I/O port 408 into signals that may be sensed as output by a human, such as sound, light, and/or touch. The input device may be an alphanumeric input device, including alphanumeric and other keys for communicating information and/or command selections to the processor 402 via the I/O port 408.

In one implementation, a communication port 410 is connected to a network by way of which the computer system 400 may receive network data useful in executing the methods and systems set out herein as well as transmitting information and network configuration changes determined thereby. Stated differently, the communication port 410 connects the computer system 400 to one or more communication interface devices configured to transmit and/or receive information between the computing system 400 and other devices by way of one or more wired or wireless communication networks or connections. Examples of such networks or connections include, without limitation, Universal Serial Bus (USB), Ethernet, Wi-Fi, Bluetooth®, Near Field Communication (NFC), Long-Term Evolution (LTE), and so on. One or more such communication interface devices may be utilized via the communication port 410 to communicate one or more other machines, either directly over a point-to-point communication path, over a wide area network (WAN) (e.g., the Internet), over a local area network (LAN), over a cellular (e.g., third generation (3G) or fourth generation (4G)) network, or over another communication means. Further, the communication port 410 may communicate with an antenna or other link for electromagnetic signal transmission and/or reception.

In an example implementation, health data, air filtration data, and software and other modules and services may be embodied by instructions stored on the data storage devices 404 and/or the memory devices 406 and executed by the processor 402. The computer system 400 may be integrated with or otherwise form part of the system shown in FIG. 2.

The system set forth in FIG. 4 is but one possible example of a computer system that may employ or be configured in accordance with aspects of the present disclosure. It will be appreciated that other non-transitory tangible computer-readable storage media storing computer-executable instructions for implementing the presently disclosed technology on a computing system may be utilized.

In the present disclosure, the methods disclosed may be implemented as sets of instructions or software readable by a device. Further, it is understood that the specific order or hierarchy of steps in the methods disclosed are instances of example approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

The described disclosure may be provided as a computer program product, or software, that may include a non-transitory machine-readable medium having stored thereon instructions, which may be used to program a computer system (or other electronic devices) to perform a process according to the present disclosure. A machine-readable medium includes any mechanism for storing information in a form (e.g., software, processing application) readable by a machine (e.g., a computer). The machine-readable medium may include, but is not limited to, magnetic storage medium, optical storage medium; magneto-optical storage medium, read only memory (ROM); random access memory (RAM); erasable programmable memory (e.g., EPROM and EEPROM); flash memory; or other types of medium suitable for storing electronic instructions.

While the present disclosure has been described with reference to various implementations, it will be understood that these implementations are illustrative and that the scope of the present disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure

I claim:

1. A method for controlling a generator connected to a load comprising:
    adjusting an output of the generator, wherein, in response to adjusting the output, a first measured value (M1) related to a forward power calculated with respect to a reference impedance ($Z_c$) tends to a first setpoint (S1) for M1;
    receiving a second setpoint (S2) for a second measured value (M2); and
    adjusting S1 to adjust the second measured value (M2) of a conventional measure of generator output towards the second setpoint (S2) for M2.

2. The method of claim 1 wherein the forward power calculated with respect to the reference impedance (Zr) is equal to $$\left| \frac{v + Z_c i^2}{2\sqrt{\text{real}(Z_c)}} \right|$$

where v is a voltage at a reference point and i is a current flowing relative to the load at the reference point.

3. The method of claim 2 wherein the first measured value (M1) related to forward power calculated with respect to the reference impedance $Z_c$ is any value, x, derived from mathematical operations on v and i such that keeping x constant for different combinations of v and i implies keeping $|v+Z_c i|$ constant for those same combinations of v and i for all combinations of v and i that are relevant to power delivery to the load.

4. The method of claim 2 wherein the first measured value (M1) related to forward power calculated with respect to the reference impedance, $Z_c$, is equal to f ($|v+Z_c i|$) where f is any one-to-one function.

5. The method of claim 1 wherein the second measured value (M2) of a conventional measure of generator output is one of voltage, current, delivered power, or forward power calculated with respect to 50Ω or 75 Ω.

6. The method of claim 2 wherein the reference point is between an output of the generator and the load.

7. The method of claim 2 wherein the reference point is mathematically extended to be further from the generator than the load is from the generator or further from the load than the generator is from the load.

8. The method of claim 1 wherein $Z_c$ is adjustable.

9. The method of claim 8 wherein $Z_c$ is adjusted in order to improve stability.

10. The method of claim 9 wherein $Z_c$ is established by setting $Z_c$ equal to $$50\frac{(1+\rho)}{1-\rho}$$

where ρ is a complex number with a magnitude between 0 and 1 and the angle of p is varied from 0° to 360° and where $Z_c$ is established based on the frequency of any oscillations in power delivery to the load and based on stable areas of operation where there is a sharp change in the oscillation frequency.

11. The method of claim 8 wherein the load is a plasma load and $Z_c$ is adjusted in order to improve plasma ignition.

12. The method of claim 1 wherein the generator is a radio frequency generator and $Z_c$ can take complex values.

13. The method of claim 1 wherein the generator is a direct current generator and $Z_c$ is restricted to real values.

14. The method of claim 1 wherein $|Z_c-Z_0|/|Z_c+Z_0|>0.3$ where $Z_0$ is a characteristic impedance of coaxial cables used to conduct power.

15. The method of claim 14 wherein $Z_0=50$.

16. A method for controlling a generator coupled with a load comprising:
receiving a setpoint for a conventional measure of generator output;
controlling a power output from the generator so that:
a conventional measure of generator output tends to the setpoint for slow changes in the setpoint and for slow changes in an impedance that the load presents to the generator, and
for fast changes in the impedance that the load presents to the generator, forward power calculated with respect to a reference impedance $Z_c$ tends to remain constant so that inside a control system bandwidth, it appears as though the generator has a source impedance of $Z_c$.

17. The method of claim 16 wherein forward power calculated with respect to a reference impedance $Z_c$ is equal to $$\left|\frac{v+Z_c i}{2\sqrt{\text{real}(Z_c)}}\right|^2$$

where v is a voltage at a reference point and i is a current flowing relative to the load at the reference point.

18. The method of claim 16 wherein the slow changes are changes that in the frequency domain have power density spectra with more than half of the total energy contained below a frequency F1 and fast changes are changes that in the frequency domain have power density spectra with more than half of the total energy contained above F1.

19. The method of claim 18 where F1 is a value between 10 Hz and 10 kHz.

20. The method of claim 16 wherein the conventional measure of generator output is one of voltage, current, delivered power, or forward power calculated with respect to 50Ω or 75 Ω.

21. The method of claim 17 wherein the reference point is between an output of the generator and the load.

22. The method of claim 17 wherein the reference point is mathematically extended to be further from the generator than the load is from the generator or further from the load than the generator is from the load.

23. The method of claim 16 wherein $Z_c$ is adjustable.

24. The method of claim 23 wherein $Z_c$ is adjusted in order to improve stability.

25. The method of claim 24 wherein $Z_c$ is established by setting $Z_c$ equal to $$50\frac{(1+\rho)}{1-\rho}$$

where ρ is a complex number with a magnitude between 0 and 1 and the angle of ρ is varied from 0° to 360° and where $Z_c$ is established based on the frequency of any oscillations in power delivery to the load and based on stable areas of operation where there is a sharp change in the oscillation frequency.

26. The method of claim 23 wherein the load is a plasma load and $Z_c$ is adjusted in order to improve plasma ignition.

27. The method of claim 16 wherein the generator is a radio frequency generator and $Z_c$ can take complex values.

28. The method of claim 16 wherein the generator is a direct current generator and $Z_c$ is restricted to real values.

29. The method of claim 16 wherein $|Z_c-Z_0|/|Z_c+Z_0|>0.3$ where $Z_0$ is a characteristic impedance of coaxial cables used to conduct power.

30. The method of claim 29 wherein $Z_0=50$.

31. A power supply comprising:
a generator;
a first controller using a first setpoint (S1) for a value related to a forward power calculated with respect to a reference impedance ($Z_c$) and a measurement (M1) of a value related to the forward power calculated with respect to the reference impedance ($Z_c$,) the first controller adjusting an output of the generator in order that M1 tends to S1; and
a second controller receiving a second setpoint (S2) for a conventional measure of generator output and a measurement (M2) of the conventional measure of generator output, the second controller adjusts the first setpoint (S1) to the first controller in order to adjust M2 towards S2.

32. The power supply of claim 31 wherein the forward power calculated with respect to a reference impedance $Z_c$ is equal to $$\left|\frac{v+Z_c i}{2\sqrt{\text{real}(Z_c)}}\right|^2$$

where v is a voltage at a reference point and i is a current flowing relative to the load at the reference point.

33. The power supply of claim 31 further comprising:
a measurement system providing the measurement (M1) related to forward power calculated with respect to the reference impedance, $Z_c$, and the measurement (M2) of the conventional measure of generator output.

34. The power supply of claim 32 wherein the value related to the forward power calculated with respect to the reference impedance $Z_c$ is any value, x, derived from mathematical operations on v and i such that keeping x constant for different combinations of v and i implies keeping $|v+Z_c i|$ constant for those same combinations of v and i for all combinations of v and i that are relevant to power delivery to the load.

35. The power supply of claim 32 wherein the value related to forward power calculated with respect to the reference impedance, $Z_c$, is equal to $f(|v+Z_c i|)$ where f is any one-to-one function.

36. The power supply of claim 31 wherein the conventional measure of generator output is one of voltage, current, delivered power, or forward power calculated with respect to 50Ω or 75 Ω.

37. The power supply of claim 32 wherein the reference point is between an output of the generator and the load.

38. The power supply of claim 32 wherein the reference point is mathematically extended to be further from the generator than the load is from the generator or further from the load than the generator is from the load.

39. The power supply of claim 31 wherein $Z_c$ is adjustable.

40. The power supply of claim 39 wherein $Z_c$ is adjusted in order to improve stability.

41. The power supply of claim 40 wherein $Z_c$ is established by setting $Z_c$ equal to $$50\frac{(1+\rho)}{1-\rho}$$

where $\rho$ is a complex number with a magnitude between 0 and 1 and the angle of $\rho$ is varied from 0° to 360° and established based on a frequency of any oscillations in power delivery to the load and based on stable areas of operation where there is a sharp change in the oscillation frequency.

42. The power supply of claim 39 wherein the load is a plasma load and $Z_c$ is adjusted in order to improve plasma ignition.

43. The power supply of claim 31 wherein the generator is a radio frequency generator and $Z_c$ can take complex values.

44. The power supply of claim 31 wherein the generator is a direct current generator and $Z_c$ is restricted to real values.

45. The power supply of claim 31 wherein $|Z_c-Z_0|/|Z_c+Z_0|>0.3$ where $Z_0$ is a characteristic impedance of coaxial cables used to conduct power.

46. The power supply of claim 45 wherein $Z_0=50$.

47. A power supply coupled to a load comprising:
a generator;
a controller for controlling the generator wherein the controller receives a setpoint for a conventional measure of generator output and controls a power output from the generator so that:
a conventional measure of generator output tends to the setpoint for slow changes in the setpoint and for slow changes in an impedance that the load presents to the generator, and
for fast changes in the impedance that the load presents to the generator, forward power calculated with respect to a reference impedance $Z_c$ tends to remain constant so that inside a bandwidth of the controller, it appears as though the generator has a source impedance of $Z_c$.

48. The power supply of claim 47 wherein the forward power calculated with respect to the reference impedance $Z_c$ is equal to $$\left|\frac{v+Z_c i}{2\sqrt{\text{real}(Z_c)}}\right|^2$$

where v is a voltage at a reference point and i is a current flowing relative to the load at the reference point.

49. The power supply of claim 47 wherein slow changes are changes that, in the frequency domain, have a power density spectra with more than half of a total energy contained below a frequency F1 and fast changes are changes that, in the frequency domain, have a power density spectra with more than half of the total energy contained above F1.

50. The power supply of claim 49 where F1 is a value between 10 Hz and 10 kHz.

51. The power supply of claim 47 wherein the conventional measure of generator output is one of voltage, current, delivered power, or forward power calculated with respect to 50Ω or 75 Ω.

52. The power supply of claim 48 wherein the reference point is between an output of the generator and the load.

53. The power supply of claim 48 wherein the reference point is mathematically extended to be further from the generator than the load is from the generator or further from the load than the generator is from the load.

54. The power supply of claim 47 wherein $Z_c$ is adjustable.

55. The power supply of claim 54 wherein $Z_c$ is adjusted in order to improve stability.

56. The power supply of claim 55 wherein $Z_c$ is established by setting $Z_c$ equal to $$50\frac{(1+\rho)}{1-\rho}$$

where $\rho$ is a complex number with a magnitude between 0 and 1 and the angle of $\rho$ is varied from 0° to 360° and established based on the frequency of any oscillations in power delivery to the load and based on stable areas of operation where there is a sharp change in the oscillation frequency.

57. The power supply of claim 54 wherein the load is a plasma load and $Z_c$ is adjusted in order to improve plasma ignition.

58. The power supply of claim 47 wherein the generator is a radio frequency generator and $Z_c$ can take complex values.

59. The power supply of claim 47 wherein the generator is a direct current generator and $Z_c$ is restricted to real values.

60. The power supply of claim 47 wherein $|Z_c-Z_0|/|Z_c+Z_0|>0.3$ where $Z_0$ is the characteristic impedance of coaxial cables used to conduct power.

61. The power supply of claim 60 wherein $Z_0=50$.

* * * * *